United States Patent
Miyamoto

(10) Patent No.: US 7,948,288 B2
(45) Date of Patent: May 24, 2011

(54) DIGITAL DELAY LOCKED LOOP CIRCUIT

(75) Inventor: Yoshikazu Miyamoto, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 178 days.

(21) Appl. No.: 12/472,054

(22) Filed: May 26, 2009

(65) Prior Publication Data

US 2009/0322392 A1  Dec. 31, 2009

(30) Foreign Application Priority Data

Jun. 27, 2008  (JP) ................................. 2008-168724

(51) Int. Cl.
*H03L 7/06* (2006.01)

(52) U.S. Cl. ........ 327/158; 327/149; 327/150; 327/159; 327/161

(58) Field of Classification Search .................. 327/149, 327/150, 158, 159, 161
See application file for complete search history.

(56) References Cited

U.S. PATENT DOCUMENTS

| 7,116,146 B2 * | 10/2006 | Tokuhiro ....................... 327/158 |
| 7,161,402 B1 * | 1/2007 | Sompur et al. ................. 327/158 |
| 7,701,274 B2 * | 4/2010 | Chae .............................. 327/158 |
| 7,782,103 B2 * | 8/2010 | Iwata ............................. 327/156 |
| 2004/0113667 A1 * | 6/2004 | Jin ................................. 327/158 |

FOREIGN PATENT DOCUMENTS

| JP | 09-238072 A | 9/1997 |
| JP | 11-074783 A | 3/1999 |
| JP | 11-205131 A | 7/1999 |
| JP | 11-316618 A | 11/1999 |

* cited by examiner

*Primary Examiner* — Lincoln Donovan
*Assistant Examiner* — Patrick O'Neill
(74) *Attorney, Agent, or Firm* — Arent Fox LLP

(57) ABSTRACT

A phase determination section determines the quantity of first fixed delay elements for delaying a clock signal by one cycle and generates a selection signal indicating the determination result. A phase adjustment section determines, based on the selection signal, the quantity of second fixed delay elements for delaying an input signal and generates the output signal by delaying the input signal by a certain phase amount. The phase adjustment section includes a variable delay unit which generates, based on the selection signal, a variable delay time allowing the delay time of the output signal to be adjusted in steps of ½″ the delay time of one of the second fixed delay elements.

8 Claims, 4 Drawing Sheets

DIGITAL DELAY LOCKED LOOP CIRCUIT

CROSS-REFERENCE TO RELATED APPLICATIONS

This application is based upon and claims the benefit of priority from prior Japanese Patent Application No. 2008-168724, filed on Jun. 27, 2008, the entire contents of which are incorporated herein by reference.

FIELD

The embodiments discussed herein relate to a digital delay locked loop (DLL) circuit.

BACKGROUND

A digital DLL circuit generates an internal clock signal by delaying the phase of an external clock signal. For example, a digital DLL circuit generates an internal clock signal delayed by one fourth of a cycle from an external clock signal to reduce jitter in the internal clock signal.

FIG. 1 shows the basic principle of a digital DLL circuit. The digital DLL circuit includes a phase determination section 1 and a phase adjustment section 2. The phase determination section 1 includes a delay generation unit 13, a stage quantity control unit 5, and a determination circuit 6. The delay generation unit 13 includes a plurality of buffer circuits (delay elements) 3, which are coupled in series, and a plurality of switch circuits 4, which are coupled between the input and output terminals of different buffer circuits 3.

The quantity of stages of the buffer circuits 3 that are coupled in series is selected by controlling the opening and closing of the plurality of switch circuits 4 with selection signals Sla0 to Slan, which are provided from the stage quantity control unit 5.

An external clock signal CLK is provided to the buffer circuit 3 in the first stage, and a clock signal (delay clock signal) CLK-D is provided from the buffer circuit 3 in the last stage or the switch circuit 4 in the last stage to the determination circuit 6. The determination circuit 6 is also provided with the external clock signal CLK.

The determination circuit 6 compares the phase of the external clock signal CLK and the phase of the delay clock signal CLK-D and provides a phase adjustment signal PC to the stage quantity control unit 5 so that the phase of the clock signal CLK-D is delayed by one cycle from the external clock signal CLK.

As shown in FIG. 2, if the phase difference of the clock signal CLK-D from the external clock signal CLK is less than one cycle ("CLK-D1" in FIG. 2), the stage quantity control unit 5 controls the opening and closing of the switch circuit 4 based on the phase adjustment signal PC to increase the quantity of stages of the buffer circuits 3 coupled in series. This lengthens the delay time of the clock signal CLK-D1.

If the phase difference of the clock signal CLK-D from the external clock signal CLK exceeds one cycle ("CLK-D3" in FIG. 2), the stage quantity control unit 5 reduces the quantity of stages of the buffer circuits 3 based on the phase adjustment signal PC. This shortens the delay time of the clock signal CLK-D3.

As a result of such an operation, the clock signal CLK-D converges to a clock signal CLK-D2 that is delayed by one cycle from the external clock signal CLK.

The stage quantity control unit 5 generates selection signals Slb0 to Slbn from the selection signals Sla0 to Slan in accordance with a phase amount set by a PHASE SET signal. The selection signals Sla0 to Slan are multiplied by a ratio that is in accordance with one fourth of a cycle to convert the selection signals Slb0 to Slbn to the selection signals Sla0 to Slan.

The phase adjustment section 2 includes a plurality of buffer circuits 7, which are coupled in series, and a plurality of switch circuits 8, which are coupled between the input and output terminals of different buffer circuits 7. The opening and closing of the plurality of switch circuits 8 are controlled by the selection signals SLb0 to SLbn provided from the stage quantity control unit 5.

An input signal IN, which is a clock signal having a similar frequency to the external clock signal CLK, is input to the buffer circuit 7 in the first stage, and an output signal OUT is output from the buffer circuit 7 in the last stage or the switch circuit 8 in the last stage. The phase of the input signal IN does not necessarily have to be the same as the phase of the external clock signal CLK.

The phase adjustment section 2 generates the output signal OUT by delaying the input signal IN by a given phase amount. The digital DLL circuit is mounted on a chip together with an internal circuit that uses the output signal OUT. When the stage quantity control unit 5 outputs the selection signals Sla0 to Slan as the selection signals SLb0 to SLbn without performing any conversions, the delay of the output signal OUT is one fourth of a cycle. The operation for such a basic case will now be described.

The phase adjustment section 2 switches the switch circuits 8 with the selection signals SLb0 to SLbn provided from the stage quantity control unit 5 so that the quantity of the buffer circuits 7 that are coupled is one fourth the quantity of the buffer circuits 3 that are coupled in the phase determination section 1. Therefore, the total quantity of the buffer circuits 7 in the phase adjustment section 2 is one fourth the total quantity of buffer circuits 3 in the phase determination section 1.

In such a configuration, the phase adjustment section 2 generates the output signal OUT delayed from the input signal IN by one fourth of a cycle.

FIG. 3 is a schematic circuit diagram of the delay generation unit 13 in the phase determination section 1. The delay generation unit 13 includes four series-coupled blocks B1 to B4. The blocks B1 to B3 each includes 64 series-coupled buffer circuits (fixed delay elements) 9 specified by addresses 0 to 63. The block B4 does not include a buffer circuit corresponding to address 0 and thus includes 63 series-coupled buffer circuits 9 specified by addresses 1 to 63. Therefore, the delay generation unit 13 includes a total of 255 series-coupled buffer circuits 9. The external clock signal CLK is input to the buffer circuit 9 in the first stage of the block B1, and the delay clock signal CLK-D is provided from the buffer circuit 9 in the last stage of the block B4 to the determination circuit 6.

A switch circuit 10 is coupled in parallel to each buffer circuit 9. Common selection signals SL1 to SL63, which are output from the stage quantity control unit 5, control the opening and closing of the switch circuits 10 in the blocks B1 to B4 that have the same address 1 to 63.

Selection signals SL0a to SL0c independently open and close the buffer circuits 9 of address 0 in each of the blocks B1 to B3.

The selection signals SL0a to SL0c and SL1 to SL63 are generated by decoding the eight-bit phase adjustment signal PC, which is generated by the determination circuit 6. The selection signals SL0a to SL0c are generated from two lower-order bits of the phase adjustment signal PC, and the selection signals SL1 to SL63 are generated from six higher-order bits of the phase adjustment signal PC.

In this case, the delay generation unit 13 opens and closes the switch circuits 10 of addresses 1 to 63 in each of the blocks B1 to B4 based on the six higher-order bits of the phase adjustment signal PC to adjust the quantity of series-coupled buffer circuits 9 in groups of four stages. The delay generation unit 13 opens and closes the switch circuits 10 of address 0 in the block B1 to B3 based on the two lower-order bits of the phase adjustment signal PC to adjust the quantity of series-coupled buffer circuits 9 in groups of single stages and within a range of zero to three stages.

Therefore, the quantity of series-coupled buffer circuits 9 is adjusted by the phase adjustment signal PC in groups of single stages and within a range of 1 to 255 stages.

FIG. 4 shows a specific configuration of the phase adjustment section 2. The phase adjustment section 2 includes 63 series-coupled buffer circuits 11 each having a similar delay time to the buffer circuits 9 of the phase determination section 1. A switch circuit 12 is coupled in parallel to each buffer circuit 11. The input signal IN is input to the buffer circuit 11 in the first stage, and the output signal OUT is output from the buffer circuit 11 or the switch circuit 12 in the last stage.

The stage quantity control unit 5 provides the selection signals SL1 to SL63 to the switch circuits 12. Therefore, the 63 buffer circuits 11 of the phase adjustment section 2 operate in a similar manner to the buffer circuits 9 of addresses 1 to 63 in the blocks B1 to B4 of the phase determination section 1.

With such a configuration, the quantity of series-coupled buffer circuits 11 in the phase adjustment section 2 is the same as the quantity of the selected buffer circuits 9 in the blocks B1 to B4 of the delay generation unit 13. Therefore, the phase adjustment section 2 generates the output signal OUT with a delay of about one fourth of a cycle from the input signal IN when the phase difference between the external clock signal CLK and the delay clock signal CLK-D output from the block B4 is adjusted to one cycle in the phase determination section 1.

In such a digital DLL circuit, the quantity of stages of the buffer circuits 11 of the phase adjustment section 2 is selected by the selection signals SL1 to SL63, which are generated by decoding the six higher-order bits of the phase adjustment signal PC. Therefore, a delay of about one fourth of a cycle is set in the phase adjustment section 2 if a delay of one cycle is set in the phase determination section 1.

However, the adjustment operation in the phase adjustment section 2 does not reflect the quantity of buffer circuits 9 selected by the two lower-order bits of the phase adjustment signal PC in the phase determination section 1. Therefore, when the buffer circuits 11 of the phase adjustment section 2 are selected by the selection signals SL1 to SL63, the quantity of the series-coupled buffer circuits 11 may not be one fourth the quantity of the buffer circuits 9 that are coupled in series in the phase determination section 1.

Therefore, the phase difference of the output signal OUT from the input signal IN is not precisely one fourth of a cycle. In such a case, the generation of jitter in the output signal OUT cannot be reduced.

A digital PLL circuit described in Japanese Laid-Open Patent Publication No. 9-238072 reduces jitter in the output signal by changing the coupled quantity of inverter circuits and the load capacitance to adjust the delay value of a delay variable circuit.

Japanese Laid-Open Patent Publication No. 11-316618 describes a DLL circuit that includes a low-precision phase adjustment circuit and a high-precision phase adjustment circuit and hierarchically operates the phase adjustment circuits. In this publication, the high-precision phase adjustment circuit adjusts the phase by changing the load capacitance.

Japanese Laid-Open Patent Publication No. 11-74783 discloses an internal clock signal generation circuit for finely adjusting the capacitance of a capacitor, which is coupled to a plurality of inverter circuits arranged in a delay line, based on the output signal of a shift register.

Japanese Laid-Open Patent Publication No. 11-205131 discloses a digital PLL circuit for adjusting the delay value in fine widths by controlling delay elements arranged in an oscillator based on a digital control signal output from a delay element control circuit.

SUMMARY

According to an aspect of the embodiments, a digital DLL circuit includes a phase determination section including: a delay generation unit including a plurality of series-coupled first fixed delay elements each having a delay time that are all similar, with the plurality of first fixed delay elements being divided into $2^n$ series-coupled blocks which generate a delay clock signal from a clock signal, and each of the blocks including at least a given quantity of the first fixed delay elements; a determination circuit which compares the clock signal and the delay clock signal and determines the quantity of the first fixed delay elements for delaying the delay clock signal by one cycle from the clock signal to generate a phase adjustment signal; and a stage quantity control unit which generates, based on the phase adjustment signal, a selection signal for selecting the quantity of the first fixed delay elements that delay the clock signal; and a phase adjustment section which generates an output signal by delaying an input signal by a certain phase amount, the phase adjustment section including: a plurality of series-coupled second fixed delay elements each having a delay time that are all similar; and a variable delay unit which generates a variable delay time allowing the delay time of the output signal to be adjusted in steps of $\frac{1}{2^n}$ the delay time of one of the second fixed delay elements, wherein the phase adjustment section determines the quantity of the second fixed delay elements for delaying the input signal and the variable delay time of the variable delay unit based on the selection signal.

Additional objects and advantages of the invention will be set forth in part in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF DRAWINGS

The invention, together with objects and advantages thereof, may best be understood by reference to the following description of the presently preferred embodiments together with the accompanying drawings in which.

DESCRIPTION OF EMBODIMENTS

A preferred embodiment of a digital DLL circuit will now be discussed with reference to the drawings.

Figure 1:
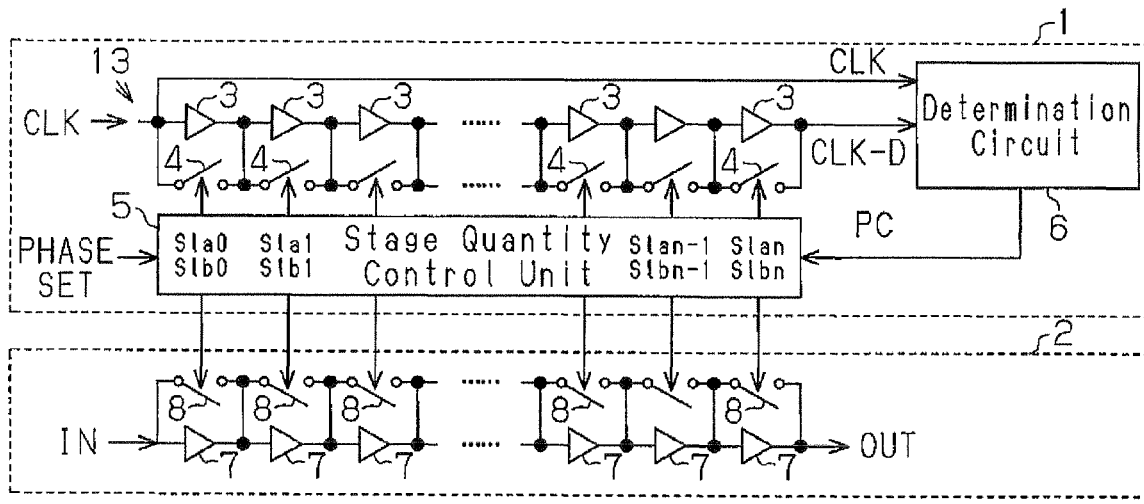
FIG. 1 is a circuit diagram showing a digital DLL circuit of the prior art.
Figure 2:
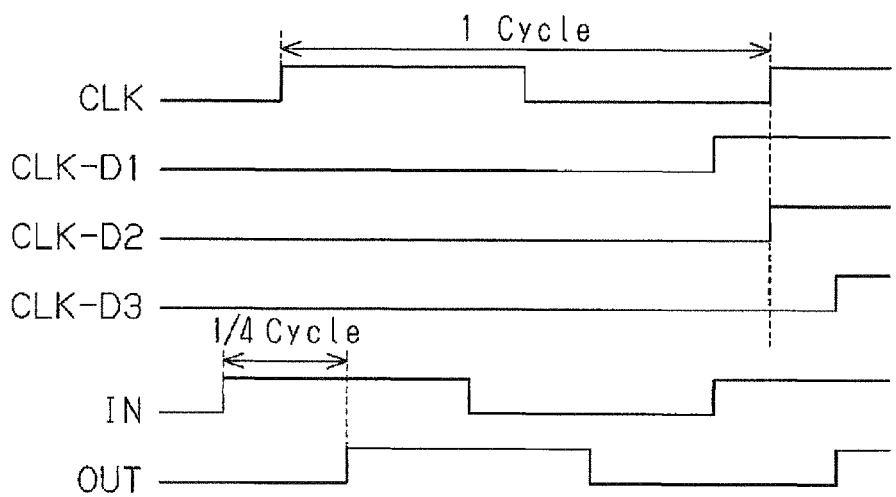
FIG. 2 is a timing waveform chart showing the basic operation of a digital DLL circuit.
Figure 3:
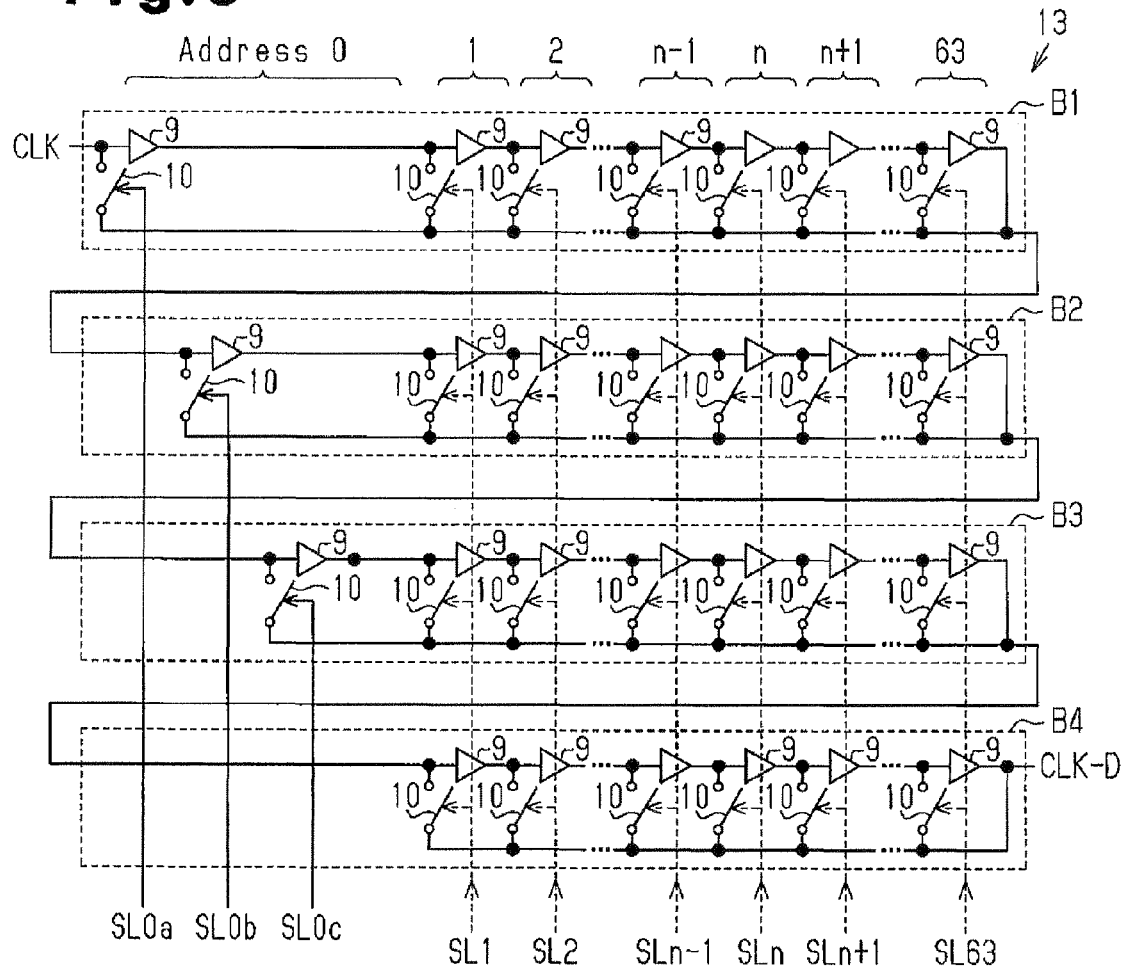
FIG. 3 is a schematic circuit diagram showing a delay generation unit.
Figure 4:
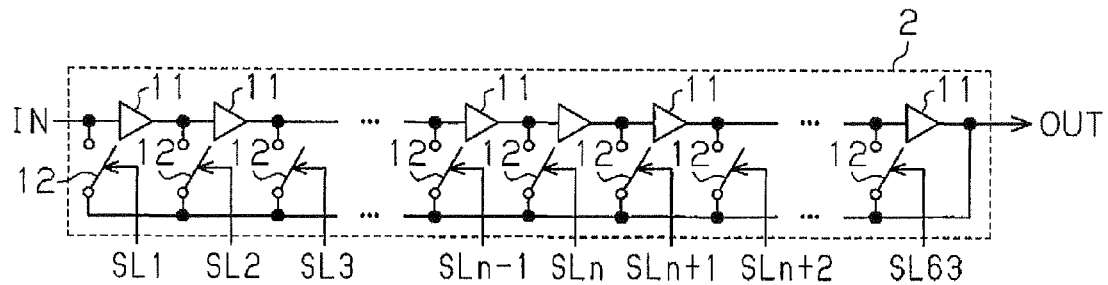
FIG. 4 is a circuit diagram showing a phase adjustment section of the prior art.
Figure 5:
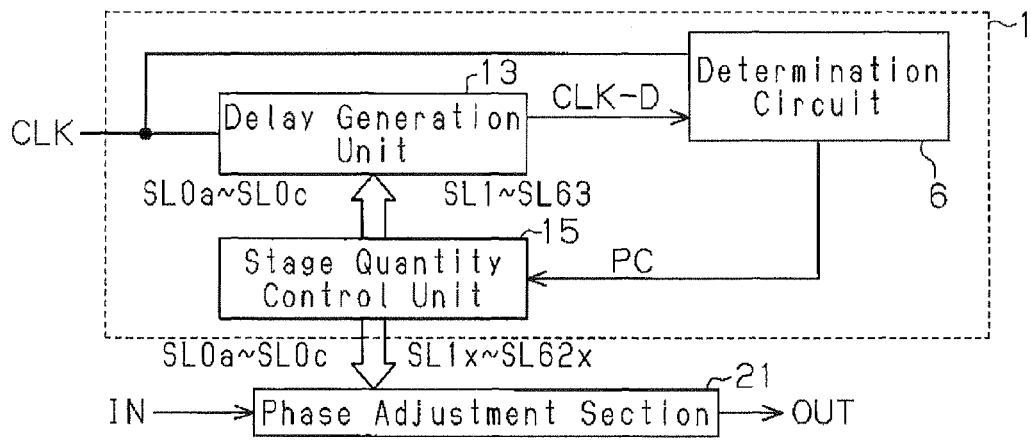
FIG. 5 is a schematic block diagram showing a digital DLL circuit.

In a digital DLL circuit shown in FIG. 5, an external clock signal CLK is input to a delay generation unit 13 and a determination circuit 6 in a phase determination section 1. The delay generation unit 13, which has a similar configuration to that shown in FIG. 3, generates a delay clock signal CLK-D by delaying the external clock signal CLK and provides the delay clock signal CLK-D to the determination circuit 6.

The determination circuit 6 compares the phase of the external clock signal CLK and the phase of the delay clock signal CLK-D and provides an eight-bit phase adjustment signal PC to a stage quantity control unit 15 to delay the delay clock signal CLK-D by one cycle from the external clock signal CLK.

The stage quantity control unit 15 generates selection signals SL0a to SL0c based on the two lower-order bits of the phase adjustment signal PC and generates selection signals SL1 to SL63 based on the six higher-order bits. The stage quantity control unit 15 provides the selection signals SL0a to SL0c and SL1 to SL63 to the delay generation unit 13.

Accordingly, the phase determination section 1 operates in a manner similar to the prior art, and the stage quantity control unit 15 generates first selection signals SL1 to SL63 and second selection signals SL0a to SL0c so as to delay the delay clock signal CLK-D output from the delay generation unit 13 by one cycle from the external clock signal CLK.

The stage quantity control unit 15 generates selection signals SL1x to SL62x based on the selection signals SL1 to SL63. The selection signals SL1x to SL62x are used by a phase adjustment section 21 to select a quantity of buffer circuits 33 (see FIG. 6) that is one stage less than the quantity of buffer circuits 9 selected in the delay generation unit 13 by the selection signals SL1 to SL63. The stage quantity control unit 15 provides the selection signals SL0a to SL0c to the phase adjustment section 21 together with the selection signals SL1x to SL62x.

The phase adjustment section 21 includes a delay time control unit 35 and an output signal generation unit 36. The delay time control unit 35 generates control signals g1 to g3 for selecting a delay time (variable delay time) of a variable delay unit 26e. The output signal generation unit 36 generates an output signal OUT delayed from an input signal IN based on the selection signals SL0a to SL0c and SL1x to SL62x. The configuration of the phase adjustment section 21 will now be described in detail with reference to FIG. 6.

The phase adjustment section 21 includes a fixed delay element line 23 formed by eight stages of series-coupled buffer circuits (fixed delay element) 22a to 22h. A comparison signal A is provided to the buffer circuit 22a in the first stage. The comparison signal A may be the external clock signal CLK or a signal having a different phase or frequency from the external clock signal CLK.

Among the buffer circuits 22a to 22h, the buffer circuit 22d in the fourth stage, the buffer circuit 22e in the fifth stage, the buffer circuit 22f in the sixth stage, and the buffer circuit 22g in the seventh stage provide output signals (fixed delay signals) D1 to D4 to a selector 24.

A calibration control unit 31 provides enable signals EN1 to EN4 to the selector 24. The selector 24 selectively provides the output signals D1 to D4 of the buffer circuits 22d to 22g to a comparison circuit 25 based on the enable signals EN1 to EN4.

Furthermore, the phase adjustment section 21 includes a variable delay element line 27 formed by four stages of series-coupled variable delay units (variable delay element) 26a to 26d. The comparison signal A is also provided to the variable delay unit 26a in the first stage of the variable delay element line 27. An output signal (variable delay signal) DV of the variable delay unit 26d in the last stage is provided to the comparison circuit 25.

The variable delay units 26a to 26d have a similar configuration. Thus, only the configuration of the variable delay unit 26a will be described here with reference to FIG. 7. The variable delay unit 26a includes a buffer circuit (fixed delay element) 28 for receiving the comparison signal A. The buffer circuit 28 may be discrete from the variable delay unit 26a. The output terminal of the buffer circuit 28 is coupled to the drains of three N-channel MOS transistors Tn1 to Tn3. Capacitors C1 to C3 are respectively coupled to the sources of the transistors Tn1 to Tn3 and ground GND. The transistors Tn1 to Tn3 and the capacitors C1 to C3 configure a variable capacitance circuit. The buffer circuit 28 solely produces an operational delay time that is set to be equal to the operational delay time produced by the buffer circuits 22a to 22h of the fixed delay element line 23.

The control signals g1 to g3, which are output from a selector 29, are provided to the gates of the transistors Tn1 to Tn3. Therefore, each of the transistors Tn1 to Tn3 operates as a switch. The capacitors C1 to C3 are selectively coupled to the output terminal of the buffer circuit 28 by activating and inactivating the transistors Tn1 to Tn3 with the control signals g1 to g3.

In one example, the capacitors C1 to C3 are set to have a similar capacitance. When one of the capacitors C1 to C3 is coupled to the output terminal of the buffer circuit 28, the operational delay time of the buffer circuit 28, that is, the delay time of the variable delay unit 26a is adjusted to be 1.25 times greater than that of each buffer circuit in the fixed delay element line 23.

When two of the capacitors C1 to C3 are coupled to the output terminal of the buffer circuit 28, the operational delay time of the buffer circuit 28 is adjusted to be 1.5 times greater than that of each buffer circuit in the fixed delay element line 23.

When the capacitors C1 to C3 are all coupled to the output terminal of the buffer circuit 28, the operational delay time of the buffer circuit 28 is adjusted to be 1.75 times greater than that of each buffer circuit in the fixed delay element line 23.

The same control signals g1 to g3 are provided to the variable delay units 26a to 26d. Accordingly, the delay time is controlled to always be similar in each of the variable delay units 26a to 26d.

The comparison circuit 25 compares the phase of the output signal of the selector 24, which is a selected one of the output signals D1 to D4 of the buffer circuits 22d to 22g, and the phase of the output signal DV of the variable delay element line 27 to generate the control signals g1 to g3 based on the comparison result. Accordingly, the comparison circuit 25 generates four sets of control signals g1 to g3 respectively corresponding to the output signals D1 to D4. In other words, the comparison circuit 25 compares the output signals D1 to D4 with the output signal DV in order to generate first control signals g1 to g3, second control signals g1 to g3, third control signals g1 to g3, and fourth control signals g1 to g3. The four sets of control signals g1 to g3 are respectively stored in first to fourth registers 30a to 30d.

If the phase of the output signal of the selector 24 is advanced from the phase of the output signal DV of the variable delay element line 27, the control signals g1 to g3 are generated to reduce the delay time of each of the variable delay units 26a to 26b. If the phase of the output signal of the selector 24 is delayed from the phase of the output signal DV of the variable delay element line 27, the control signals g1 to g3 are generated to lengthen the delay time of each of the variable delay units 26a to 26b.

The enable signals EN1 to EN4 generated by the calibration control unit 31 are provided to the first to fourth registers 30a to 30d. The enable signal EN1 activates the first register 30a, in which case the first register 30a stores the first control signals g1 to g3 output from the comparison circuit 25.

The enable signal EN2 activates the second register 30b, in which case the second register 30b stores the second control signals g1 to g3 output from the comparison circuit 25. The enable signal EN3 activates the third register 30b, in which case the second register 30b stores the third control signals g1 to g3 output from the comparison circuit 25. The enable signal EN24 activates the fourth register 30d, in which case the fourth register 30d stores the fourth control signals g1 to g3 output from the comparison circuit 25.

The first to fourth control signals g1 to g3 held in the first to the fourth registers 30a to 30d are provided to the selector 29. The selector 29 is also provided with the enable signals EN1 to EN4. The selector 29 provides the first control signals g1 to g3 held in the first register 30a to each variable delay unit 26a to 26d in response to the enable signal EN1. Further, the selector 29 provides the second control signals g1 to g3 held in the second register 30b to each variable delay unit 26a to 26d in response to the enable signal EN2.

The selector 29 also provides the third control signals g1 to g3 held in the third register 30c to each variable delay unit 26a to 26d in response to the enable signal EN3. Further, the selector 29 provides the fourth control signals g1 to g3 held in the fourth register 30d to each variable delay unit 26a to 26d in response to the enable signal EN4.

The enable signals EN1 to EN4 output from the calibration control unit 31 are also provided to the selector 24. The selector 24 provides the output signal D1 of the buffer circuit 22d to the comparison circuit 25 in response to the enable signal EN1. The selector 24 provides the output signal D2 of the buffer circuit 22e to the comparison circuit 25 in response to the enable signal EN2.

The selector 24 provides the output signal D3 of the buffer circuit 22f to the comparison circuit 25 in response to the enable signal EN3. Further, the selector 24 provides the output signal D4 of the buffer circuit 22g to the comparison circuit 25 in response to the enable signal EN4.

The calibration control unit 31 enables the enable signals EN1 to EN4 in an orderly manner, for example, in constant time cycles when the digital DLL circuit is activated. In other words, when the phase of the output signal DV of the variable delay element line 27 matches the phase of the output signal selected by the selector 24, the calibration control unit 31 enables a different enable signal to switch the output signal of the selector 24 in an orderly manner.

For example, when the calibration control unit 31 outputs the enable signal EN1, the output signal D1 of the buffer circuit 22d is provided from the selector 24 to the comparison circuit 25. In this case, the first control signals g1 to g3 output from the comparison circuit 25 are stored in the first register 30a by the enable signal EN1. The first control signals g1 to g3 held in the first register 30a are provided to each variable delay unit 26a to 26d from the selector 29 by the enable signal EN1.

The comparison circuit 25 adjusts the first control signals g1 to g3 (e.g., signal level) so that the phase of the output signal D1 of the buffer circuit 22d matches the phase of the output signal DV of the variable delay element line 27. This updates the value of the first register 30a and provides the first control signals g1 to g3 stored in the first register 30a again to each variable delay unit 26a to 26d via the selector 29.

Through such operations, the phase of the output signal DV of the variable delay element line 27 converges and matches with the phase of the output signal D1 of the buffer circuit 22d. In other words, the first control signals g1 to g3 are generated so that the delay time of the four stages of variable delay units 26a to 26d in the variable delay element line 27 matches the delay time of the four stages of buffer circuits 22a to 22d in the fixed delay element line 23.

The first control signals g1 to g3 respectively inactivate the transistors Tn1 to Tn3 in each variable delay unit 26a to 26d. Therefore, the ratio of the delay time of each buffer circuit 22a to 22d and the delay time of each variable delay unit 26a to 26d is 1:1. When the input of the enable signal EN1 to the first register 30a is suspended, the present first control signals g1 to g3 are held in the first register 30a.

When the calibration control unit 31 outputs the enable signal EN2, the output signal D2 of the buffer circuit 22e is provided from the selector 24 to the comparison circuit 25. In this case, the second control signals g1 to g3 output from the comparison circuit 25 are stored in the second register 30b by the enable signal EN2. The second control signals g1 to g3 held in the second register 30b are provided to each variable delay unit 26a to 26d from the selector 29 by the enable signal EN2.

The comparison circuit 25 adjusts the second control signals g1 to g3 (e.g., signal level) so that the phase of the output signal D2 of the buffer circuit 22e matches the phase of the output signal DV of the variable delay element line 27. This updates the value of the second register 30b and provides the second control signals g1 to g3 stored in the second register 30b again to each variable delay unit 26a to 26d via the selector 29.

Through such operations, the phase of the output signal DV of the variable delay element line 27 converges and matches with the phase of the output signal D2 of the buffer circuit 22e. In other words, the second control signals g1 to g3 are generated so that the delay time of the four stages of variable delay units 26a to 26d in the variable delay element line 27 matches the delay time of the five stages of buffer circuits 22a to 22e in the fixed delay element line 23.

The second control signals g1 to g3 activate the transistor Tn1 in each variable delay unit 26a to 26d. Therefore, the ratio of the delay time of each buffer circuit 22a to 22e and the delay time of each variable delay unit 26a to 26d is 1:1.25. When the input of the enable signal EN2 to the first register 30b is suspended, the present second control signals g1 to g3 are held in the second register 30b.

When the calibration control unit 31 outputs the enable signal EN3, the output signal D3 of the buffer circuit 22f is provided from the selector 24 to the comparison circuit 25. In this case, the third control signals g1 to g3 output from the comparison circuit 25 are stored in the third register 30c by the enable signal EN3. The third control signals g1 to g3 held in the third register 30c are provided to each variable delay unit 26a to 26d from the selector 29 by the enable signal EN3.

The comparison circuit 25 adjusts the third control signals g1 to g3 (e.g., signal level) so that the phase of the output signal D3 of the buffer circuit 22f matches the phase of the output signal DV of the variable delay element line 27. This updates the value of the third register 30c and provides the third control signals g1 to g3 stored in the third register 30c again to each variable delay unit 26a to 26d via the selector 29.

Through such operations, the phase of the output signal DV of the variable delay element line 27 converges and matches with the phase of the output signal D3 of the buffer circuit 22f. In other words, the third control signals g1 to g3 are generated so that the delay time of the four stages of variable delay units 26a to 26d in the variable delay element line 27 matches the delay time of the six stages of buffer circuits 22a to 22f in the fixed delay element line 23.

The third control signals g1 to g3 activate the transistors Tn1 and Tn2 of each variable delay unit 26a to 26d. Therefore, the ratio of the delay time of each buffer circuit 22a to 22f and the delay time of each variable delay unit 26a to 26d is 1:1.5. When the input of the enable signal EN3 to the third register 30c is suspended, the present third control signals g1 to g3 are held in the third register 30c.

When the calibration control unit 31 outputs the enable signal EN4, the output signal D4 of the buffer circuit 22g is provided from the selector 24 to the comparison circuit 25. In this case, the fourth control signals g1 to g3 output from the comparison circuit 25 are stored in the fourth register 30d by the enable signal EN4. The fourth control signals g1 to g3 held in the fourth register 30d are provided to each variable delay unit 26a to 26d from the selector 29 by the enable signal EN4.

The comparison circuit 25 adjusts the fourth control signals g1 to g3 (e.g., signal level) so that the phase of the output signal D4 of the buffer circuit 22g matches the phase of the output signal DV of the variable delay element line 27. This updates the value of the fourth register 30d and provides the fourth control signals g1 to g3 stored in the fourth register 30c again to each variable delay unit 26a to 26d via the selector 29.

Through such operations, the phase of the output signal DV of the variable delay element line 27 converges and matches with the phase of the output signal D4 of the buffer circuit 22g. In other words, the fourth control signals g1 to g3 are generated so that the delay time of the four stages of variable delay units 26a to 26d in the variable delay element line 27 matches the delay time of the seven stages of buffer circuits 22a to 22g in the fixed delay element line 23.

The fourth control signals g1 to g3 activate the transistors Tn1 to Tn3 of each variable delay unit 26a to 26d. Therefore, the ratio of the delay time of each buffer circuit 22a to 22g and the delay time of each variable delay unit 26a to 26d is 1:1.75. When the input of the enable signal EN4 to the fourth register 30d is suspended, the present fourth control signals g1 to g3 are held in the fourth register 30d.

The first to the fourth control signals g1 to g3 held in the first to the fourth registers 30a to 30d based on the operation of the calibration control unit 31 are provided to the selector 32. The selector 32 is also provided with the selection signals SL0a to SL0c generated by the stage quantity control unit 15. The selector 32 selectively outputs the first to the fourth control signals g1 to g3 held in the first to the fourth registers 30a to 30d based on the selection signals SL0a to SL0c.

If the selection signals SL0a to SL0c all have an H level, the three switch circuits 10 of address 0 are all activated in the blocks B1 to B3 of the delay generation unit 13. In this case, the selector 32 selects and outputs the first control signals g1 to g3 held in the first register 30a.

If two of the selection signals SL0a to SL0c have an H level, two of the three switch circuits 10 of address 0 are activated in the blocks B1 to B3 of the delay generation unit 13. In this case, the selector 32 selects and outputs the second control signals g1 to g3 held in the second register 30b.

If one of the selection signals SL0a to SL0c has an H level, one of the three switch circuits 10 of address 0 is activated in the blocks B1 to B3 of the delay generation unit 13. In this case, the selector 32 selects and outputs the third control signals g1 to g3 held in the third register 30c.

If the selection signals SL0a to SL0c all have an L level, the three switch circuits 10 of address 0 are all inactivated in the blocks B1 to B3 of the delay generation unit 13. In this case, the selector 32 selects and outputs the fourth control signals g1 to g3 held in the fourth register 30d.

Figure 7:
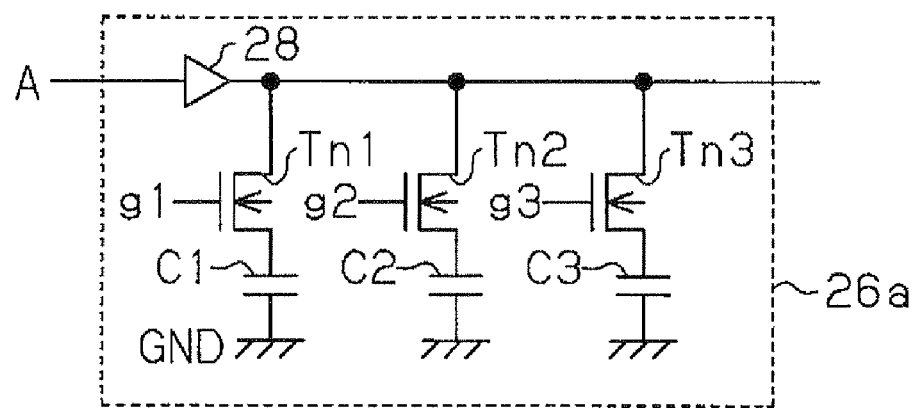
FIG. 7 is a schematic circuit diagram showing a variable delay unit.

The control signals g1 to g3 selected by the selector 32 are provided to the variable delay unit 26e. The variable delay unit 26e has a similar configuration to the variable delay units 26a to 26d (FIG. 7). Therefore, the variable delay unit 26e generates a delay time determined by the delay time of the buffer circuit 28 and the variable delay time corresponding to the capacitors C1 to C3 selectively coupled to the output terminal of the buffer circuit 28. In other words, the delay time of the variable delay unit 26e is set to be one of 1 times, 1.25 times, 1.5 times, or 1.75 times greater than the delay time of the buffer circuits 9 (fixed delay elements) in the delay generation unit 13 based on the selected control signal g1 to g3.

When the first control signals g1 to g3 held in the first register 30a are input to the variable delay unit 26e, the delay time of the variable delay unit 26e corresponds to one stage of the buffer circuit 9 of the delay generation unit 13.

When the second control signals g1 to g3 held in the second register 30b are input to the variable delay unit 26e, the delay time of the variable delay unit 26e corresponds to 1.25 stages of the buffer circuit 9.

When the third control signals g1 to g3 held in the third register 30c are input to the variable delay unit 26e, the delay time of the variable delay unit 26e corresponds to 1.5 stages of the buffer circuit 9.

When the fourth control signals g1 to g3 held in the fourth register 30d are input to the variable delay unit 26e, the delay time of the variable delay unit 26e corresponds to 1.75 stages of the buffer circuit 9.

The phase adjustment section 21 includes 62 stages of series-coupled buffer circuits (fixed delay elements) 33. The output terminal of the buffer circuit 33 in the last stage is coupled to the input terminal of the variable delay unit 26e, and the input signal IN is provided to the input terminal of the buffer circuit 33 in the first stage. The output signal OUT is output from the output terminal of the variable delay unit 26e.

A switch circuit 34 is coupled in parallel to each buffer circuit 33. The opening and closing of each switch circuit 34 is controlled based on the selection signals SL1x to SL62x output from the stage quantity control unit 15. Therefore, the selection signals SL1x to SL62x adjusts the quantity of the buffer circuits 33 that are coupled in series in groups of single stages within a range of 1 to 62 stages.

The selection signals SL1x to SL62x provided from the stage quantity control unit 15 to the phase adjustment section 21 are generated so that quantity of the selected buffer circuits 33 is one stage less than the quantity of buffer circuits 9 selected in each block B1 to B4. Therefore, if the quantity of the buffer circuits 9 coupled in series in each block B1 to B4 of the delay generation unit 13 is N stages, the quantity of the buffer circuits 33 selected by the selection signals SL1x to SL62x in the phase adjustment section 21 is N−1 stages.

The operation of the digital DLL circuit configured as described above will now be discussed.

When the digital DLL circuit is activated, the calibration control unit 31 of the phase adjustment section 21 adjusts the delay time of each variable delay unit 26a to 26d four times in accordance with each of the output signals D1 to D4. The first control signals g1 to g3, which set the delay time corresponding to one stage of the buffer circuits 22a to 22h, are held in the first register 30a. The second control signals g1 to g3, which set the delay time corresponding to 1.25 stages of the buffer circuits 22a to 22h, are held in the second register 30b. The third control signals g1 to g3, which set the delay time corresponding to 1.5 stages of the buffer circuits 22a to 22h, are held in the third register 30c. The fourth control signals g1 to g3, which set the delay time corresponding to 1.75 stages of the buffer circuits 22a to 22h, are held in the fourth register 30d.

When the external clock signal CLK is input to the phase determination section 1, the determination circuit 6 and the stage quantity control unit 15 generate the selection signals SL0a to SL0c and SL1 to SL63 so that there is a phase difference of one cycle between the external clock signal CLK and the delay clock signal CLK-D from the delay generation unit 13.

The stage quantity control unit 15 provides the selection signals SL0a to SL0c and SL1x to SL62x to the phase adjustment section 21. The phase adjustment section 21 selects the quantity of buffer circuits 33 that are to be coupled in series by the selection signals SL1x to SL62x. The phase adjustment section 21 also sets the delay time of the variable delay unit 26e to the delay time corresponding to 1 stage, 1.25 stages, 1.5 stages, and 1.75 stages of the buffer circuits 9 in the delay generation unit 13 based on the selection signals SL0a to SL0c.

For example, if N stages of the buffer circuits 9 at addresses 1 to 63 are selected in each block B1 to B4 of the delay generation unit 13 and one of the three buffer circuits 9 at address 0 in the blocks B1 to B3 is selected, the total quantity of the buffer circuits 9 selected in the delay generation unit 13 is (4N+1) stages. In this case, the phase adjustment section 21 selects (N−1) stages of the buffer circuits 33 and adjusts the delay time of the variable delay unit 26e in correspondence with 1.25 stages of the buffer circuits 9. As a result, the total delay time corresponds to (N+0.25) stages of buffer circuits 9, which is one fourth the quantity of the stages of buffer circuits 9 selected in the delay generation unit 13.

If N stages of the buffer circuits 9 at addresses 1 to 63 are selected in each block B1 to B4 and two of the three buffer circuits 9 at address 0 in the blocks B1 to B3 are selected, the total quantity of the buffer circuits 9 selected in the delay generation unit 13 is (4N+2) stages. In this case, the phase adjustment section 21 selects (N−1) stages of the buffer circuits 33 and adjusts the delay time of the variable delay unit 26e in correspondence with 1.5 stages of the buffer circuit 9. As a result, the total delay time corresponds to (N+0.5) stages of buffer circuits 9, which is one fourth the quantity of the stages of buffer circuits 9 selected in the delay generation unit 13.

If N stages of the buffer circuits 9 at addresses 1 to 63 are selected in each block B1 to B4 and all of the three buffer circuits 9 at address 0 in the blocks B1 to B3 are selected, the total quantity of buffer circuits 9 selected in the delay generation unit 13 is (4N+3) stages. In this case, the phase adjustment section 21 selects (N−1) stages of the buffer circuits 33 and adjusts the delay time of the variable delay unit 26e in correspondence with 1.75 stages of the buffer circuits 9. As a result, the total delay time corresponds to (N+0.75) stages of buffer circuits 9, which is one fourth the quantity of the stages of buffer circuits 9 selected in the delay generation unit 13.

If N stages of the buffer circuits 9 of addresses 1 to 63 are selected in each block B1 to B4 and none of the three buffer circuits 9 at address 0 in the blocks B1 to B3 are selected, the total quantity of buffer circuits 9 selected in the delay generation unit 13 is (4N) stages. In this case, the phase adjustment section 21 selects (N−1) stages of the buffer circuits 33 and adjusts the delay time of the variable delay unit 26e in correspondence with 1 stage of the buffer circuit 9. As a result, the total delay time corresponds to N stages of buffer circuits 9, which is one fourth the quantity of the stages of buffer circuits 9 selected in the delay generation unit 13. Therefore, the phase difference of the output signal OUT from the input signal IN becomes precisely one fourth of a cycle.

The digital DLL circuit of the preferred embodiment has the advantages described below.

(1) The phase determination section 1 generates the selection signals SL0a to SL0c and SL1 to SL63 to generate the delay clock signal CLK-D delayed by a phase difference of one cycle from the external clock signal CLK. The phase adjustment section 21 generates the output signal OUT delayed by the phase difference of one fourth of a cycle from the input signal IN using the selection signals SL0a to SL0c and SL1x to SL62x. This reduces jitter in the output signal OUT delayed from the input signal IN.

(2) The phase adjustment section 21 generates a delay time corresponding to 1 stage, 1.25 stages, 1.5 stages, or 1.75 stages of the buffer circuits 33 (buffer circuits 9) with the variable delay unit 26e based on the selection signals SL0z to SL0c and SL1 to SL63. This generates a delay time that corresponds to one fourth the quantity of the stages of buffer circuits 9 selected in the phase determination section 1 with further precision.

(3) The calibration control unit 31 sequentially performs calibration so that the delay times of the four variable delay units 26a to 26d matches the delay time corresponding to four stages, five stages, six stages, and seven stages of the buffer circuits 28 (the buffer circuits 22a to 22h) to generate the first to the fourth control signals g1 to g3, which set the delay time of the variable delay unit 26e. Therefore, the first to the fourth control signals g1 to g3 for setting the delay time of the variable delay unit 26e to a delay time corresponding to 1 stage, 1.25 stages, 1.5 stages, and 1.75 stages of the buffer circuits 33 (buffer circuit 9) are easily and automatically generated.

(4) The first to the fourth control signals g1 to g3 generated by the operation of the calibration control unit 31 are held in the first to the fourth registers 30a to 30d. Therefore, the delay time corresponding to 1 stage, 1.25 stages, 1.5 stages, or 1.75 stages of the buffer circuits 33 is easily selected by selectively providing the first to fourth control signals g1 to g3 to the variable delay unit 26e based on the selection signals SL0a to SL0c.

(5) Each of the variable delay units 26a to 26d is configured to generate a delay time corresponding to 1 stage, 1.25 stages, 1.5 stages, and 1.75 stages of the buffer circuits 22a to 22h. Each of the variable delay units 26a to 26d easily generates one of the four delay times by selecting the capacitors that are to be coupled to the output terminal of the buffer circuit 28. Therefore, the variable delay unit 26e, which is configured in a similar manner to the variable delay units 26a to 26d, also easily generates the variable delay time.

It should be apparent to those skilled in the art that the present invention may be embodied in many other specific forms without departing from the spirit or scope of the invention. Particularly, it should be understood that the invention may be embodied in the following forms.

The variable delay units 26a to 26e may adjust the delay time with further precision by adjusting the load capacitance with a control signal having more bits than the three-bit control signals g1 to g3.

The output signal OUT does not have to generated by delaying the input signal IN by one fourth of a cycle. For example, the output signal OUT may be generated by delaying the input signal IN by $\frac{1}{2^n}$ of a cycle, such as one half of a cycle or one eighth of a cycle. In this case, there are $2^n$ possible delay times that can be set in the variable delay unit 26a (26e), and the control signals g1 to g($2^n$−1) may be generated so that the delay time of the variable delay unit corresponding to $2^n$ stages to match the delay time of the buffer circuits from the $2^n$ stage to the $2^{n+1}$−1 stage.

Figure 6:
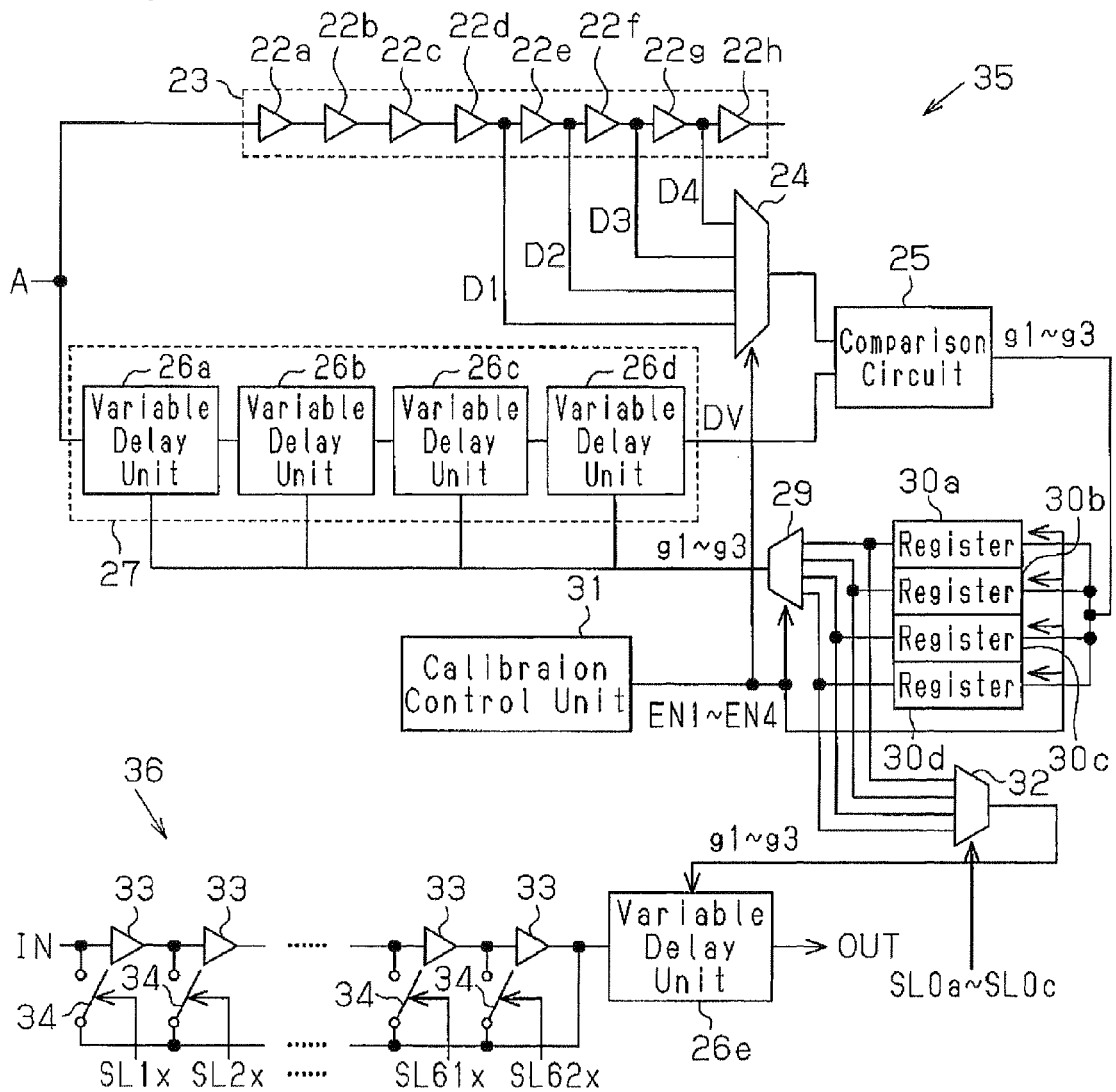
FIG. 6 is a schematic block diagram showing a phase adjustment section.

In the example illustrated in FIG. 6, the buffer circuits (fixed delay elements) 28 of the variable delay unit 26e has a similar delay time to each of the buffer circuits (fixed delay elements) 33. Thus, the output signal generation unit 36 may be assumed to include substantially 63 series-coupled buffer circuits 33 (62 buffer circuits 33+one buffer circuit 28). In this case, the selection signals SL1 to SL63 may be used in lieu of the selection signals SL1x to SL62x. In other words, the stage quantity control unit 15 may use the first selection signals SL0a to SL0c and the second selection signals SL1 to SL63 for both of the delay generation unit 13 and the phase adjustment section 21 without generating the selection signals SL1x to SL62x. Therefore, the variable delay unit 26e only needs to have at least the variable delay circuit including the transistors Tn1 to Tn3 and the capacitors C1 to C3.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A digital DLL circuit comprising:
   a phase determination section including:
   a delay generation unit including a plurality of series-coupled first fixed delay elements each having a delay time that are all similar, with the plurality of first fixed delay elements being divided into $2^n$ series-coupled blocks which generate a delay clock signal from a clock signal, and each of the blocks including at least a given quantity of the first fixed delay elements;
   a determination circuit which compares the clock signal and the delay clock signal and determines the quantity of the first fixed delay elements for delaying the delay clock signal by one cycle from the clock signal to generate a phase adjustment signal; and
   a stage quantity control unit which generates, based on the phase adjustment signal, a selection signal for selecting the quantity of the first fixed delay elements that delay the clock signal; and
   a phase adjustment section which generates an output signal by delaying an input signal by a certain phase amount, the phase adjustment section including:
   a plurality of series-coupled second fixed delay elements each having a delay time that are all similar; and
   a variable delay unit which generates a variable delay time allowing the delay time of the output signal to be adjusted in steps of $\frac{1}{2^n}$ the delay time of one of the second fixed delay elements, wherein the phase adjustment section determines the quantity of the second fixed delay elements for delaying the input signal and the variable delay time of the variable delay unit based on the selection signal.

2. The digital DLL circuit according to claim 1, wherein:
   the phase adjustment signal includes lower-order n bits and higher-order bits;
   the stage quantity control unit selects the first fixed delay elements in groups of $2^n$ stages with a first selection signal generated from the higher-order bits of the phase adjustment signal, and the stage quantity control unit selects the first fixed delay elements in groups of single stages with a second selection signal generated from the lower-order n bits; and
   the phase adjustment section determines the quantity of the second fixed delay elements based on the first selection signal and determines the variable delay time based on the second selection signal.

3. The digital DLL circuit according to claim 1, wherein:
   the delay generation unit includes series-coupled first, second, third, and fourth blocks, with each of the first to third blocks including 64 series-coupled first fixed delay elements, and the fourth block including at least 63 series-coupled first fixed delay elements;
   the phase adjustment signal includes two lower-order bits and six higher-order bits;
   the stage quantity control unit selects the first fixed delay elements in the first to fourth blocks in groups of four stages with a first selection signal generated from the six higher-order bits, and the stage quantity control unit selects the first fixed delay elements in the first to third blocks in groups of single stages with a second selection signal generated from the two lower-order bits; and
   the phase adjustment section determines the quantity of the second fixed delay elements based on the first selection signal and determines the variable delay time based on the second selection signal, with the variable delay time allowing the delay time of the output signal to be adjusted in steps of 0.25 the delay time of one of the second fixed delay elements.

4. The digital DLL circuit according to claim 3, wherein the phase adjustment section further includes:
   a delay time control unit including:
   a fixed delay element line including eight stages of series-coupled third fixed delay elements, with a comparison signal being input to the third fixed delay elements in the first stage;
   a variable delay element line including four stages of series-coupled variable delay elements, with the comparison signal being input to the variable delay element in the first stage;
   a comparison circuit which compares first to fourth fixed delay signals output from the fixed delay elements in the fourth, fifth, sixth, and seventh stages of the fixed delay elements line with a variable delay signal output from the variable delay element line to generate first to fourth control signals for matching the phase of the variable delay signal with the phase of each of the first to the fourth fixed delay signals;

first to fourth registers which respectively hold the first to fourth control signals generated by the comparison circuit; and a calibration control circuit which sequentially provides the comparison circuit with the first to fourth fixed delay signals while providing each of the variable delay elements in parallel with a corresponding one of the first to fourth control signals held in the first to fourth registers to adjust the delay time to be substantially the same in each of the variable delay elements with the corresponding control signal so as to allow the comparison circuit to generate the first to fourth control signals; and an output signal generation unit which controls generation of the output signal based on the first and second selection signals and includes a selector which selectively provides the first to fourth control signals held in the first to the fourth registers to the variable delay unit in response to the second selection signal;

wherein the variable delay unit sets the variable delay time to zero or adjusts the variable delay time to a delay time corresponding to 0.25 stages, 0.5 stages, or 0.75 stages of the second fixed delay elements based on a selected one of the first to fourth control signals.

5. The digital DLL circuit according to claim 4, wherein:

the variable delay unit includes:

a fourth fixed delay element having a delay time corresponding to one of the second fixed delay elements; and a variable delay circuit which generates the variable delay time based on the selected one of the first to fourth control signals, with the delay time of the variable delay unit being adjusted to a delay time corresponding to 1 stage, 1.25 stages, 1.5 stages, or 1.75 stages of the second fixed delay elements; and the output signal generation unit selects, based on the first selection signal, the quantity of the second fixed delay elements that is one stage less than the quantity of the first fixed delay element selected in each of the first to fourth blocks.

6. The digital DLL circuit according to claim 4, wherein the variable delay elements and the variable delay unit each include a fourth fixed delay element and a variable capacitance circuit coupled between an output terminal of the fourth fixed delay element and ground to adjust a capacitance of the variable capacitance circuit based on the selected one of the first to the fourth control signals.

7. A digital DLL circuit comprising:

a plurality of first fixed delay elements each having a delay time substantially equal to one another and selectively coupled in series to generate a delay clock signal by delaying a clock signal;

a stage quantity control unit which generates a first selection signal for selecting the first fixed delay elements in groups of $2^n$ stages and a second selection signal for selecting the first fixed delay elements in groups of single stages to adjusting the phase difference between the clock signal and the delay clock signal to a first phase amount;

a plurality of second fixed delay elements each having a delay time substantially equal to one another and selectively coupled in series to generate an output signal by delaying an input signal by a second phase amount, in which the second fixed delay elements are selected in groups of single stages based on the first selection signal; and a variable delay unit which generates a variable delay time allowing the second phase amount to be adjusted in steps of $½^n$ the delay time of one of the second fixed delay elements based on the second selection signal.

8. The digital DLL circuit according to claim 7, wherein the second phase amount is smaller than the first phase amount.

* * * * *